(12) United States Patent
Bartenschlager et al.

(10) Patent No.: US 6,188,273 B1
(45) Date of Patent: Feb. 13, 2001

(54) INTEGRATED CIRCUIT HAVING A CONTACT-MAKING POINT FOR SELECTING AN OPERATING MODE OF THE INTEGRATED CIRCUIT

(75) Inventors: Rainer Bartenschlager, Kaufbeuren; Christian Sichert; Zoltan Manyoki, both of München, all of (DE)

(73) Assignee: Siemens Aktiengesellschaft, Munich (DE)

( * ) Notice: Under 35 U.S.C. 154(b), the term of this patent shall be extended for 0 days.

(21) Appl. No.: 09/408,476

(22) Filed: Sep. 28, 1999

(30) Foreign Application Priority Data

Sep. 28, 1998 (DE) .............................................. 198 44 481

(51) Int. Cl.$^7$ ................................................... H01L 25/00
(52) U.S. Cl. ............................................ 327/565; 326/38
(58) Field of Search ................................... 327/199, 200, 327/525, 565; 326/37, 38

(56) References Cited

U.S. PATENT DOCUMENTS 5,047,657  9/1991  Seevinck et al. .
5,777,488 * 6/1999  Dryer et al. ............................ 326/38
5,910,732 * 6/1999  Trimberger ............................ 326/38

FOREIGN PATENT DOCUMENTS 2534181    2/1976   (DE) .
2807531    8/1978   (DE) .
2543403    1/1981   (DE) .
0570158A2  11/1993  (EP) .

* cited by examiner

Primary Examiner—Kenneth B. Wells
(74) Attorney, Agent, or Firm—Herbert L. Lerner; Laurence A. Greenberg; Werner H. Stemer

(57) ABSTRACT

An integrated circuit has a first voltage generator, which is connected via a first switching element to a contact-making point for external contact making with the circuit. In addition, it has a first digital control device, via which the contact-making point is connected to a control input of the first switching element. In this case, the first control device switches the first switching element on or turns the latter off by a first digital control signal, the level of which is dependent on the potential of the contact-making point. Furthermore, the contact-making point is connected to the input of a second digital control device, which supplies a digital operating mode signal at its output, the level of which operating mode signal is dependent on the potential of the contact-making point.

3 Claims, 2 Drawing Sheets

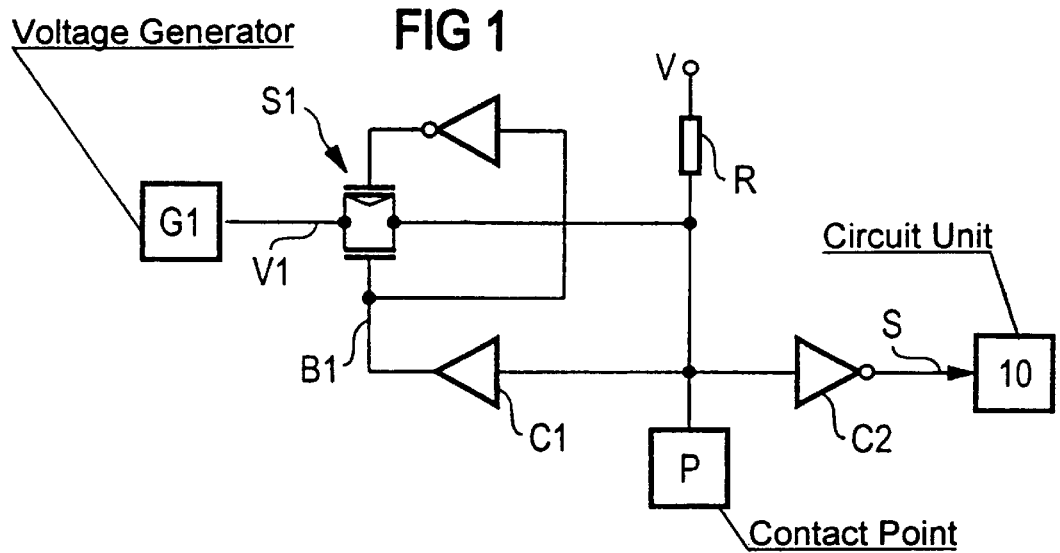
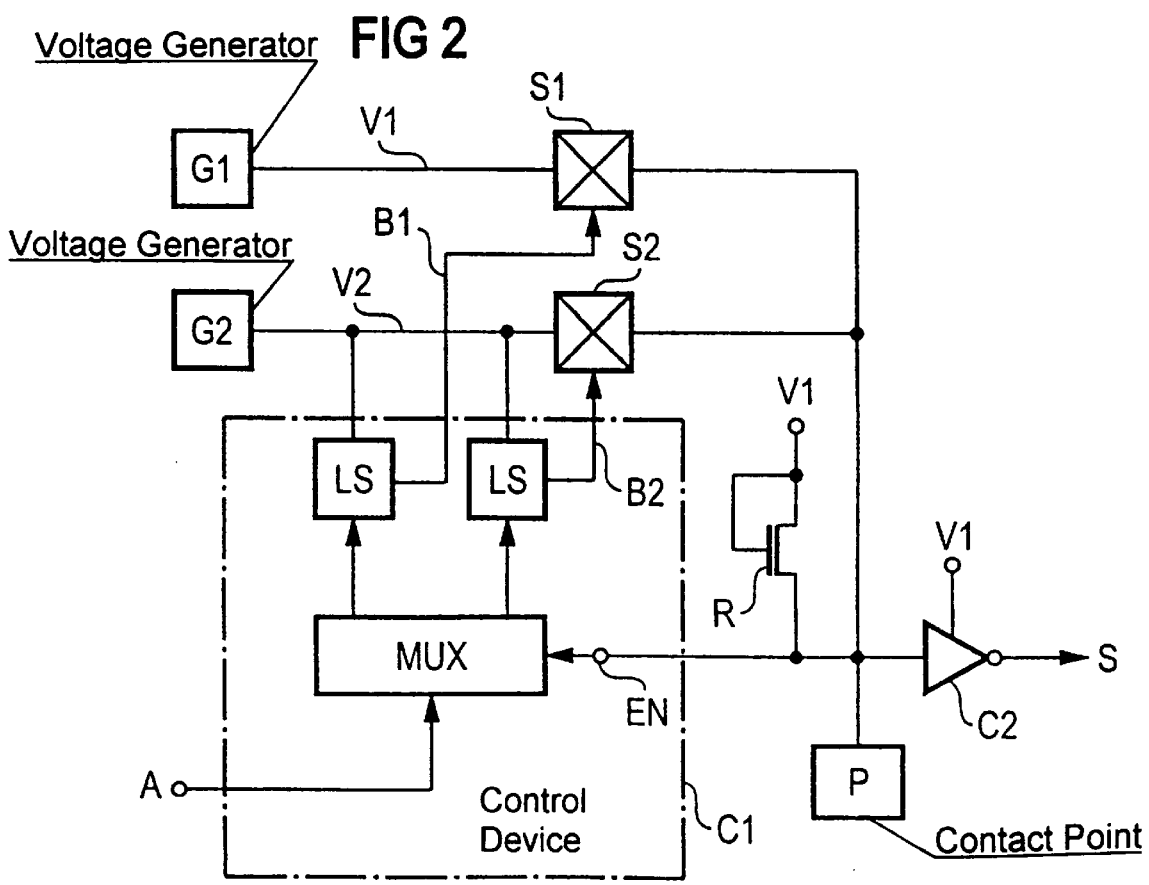

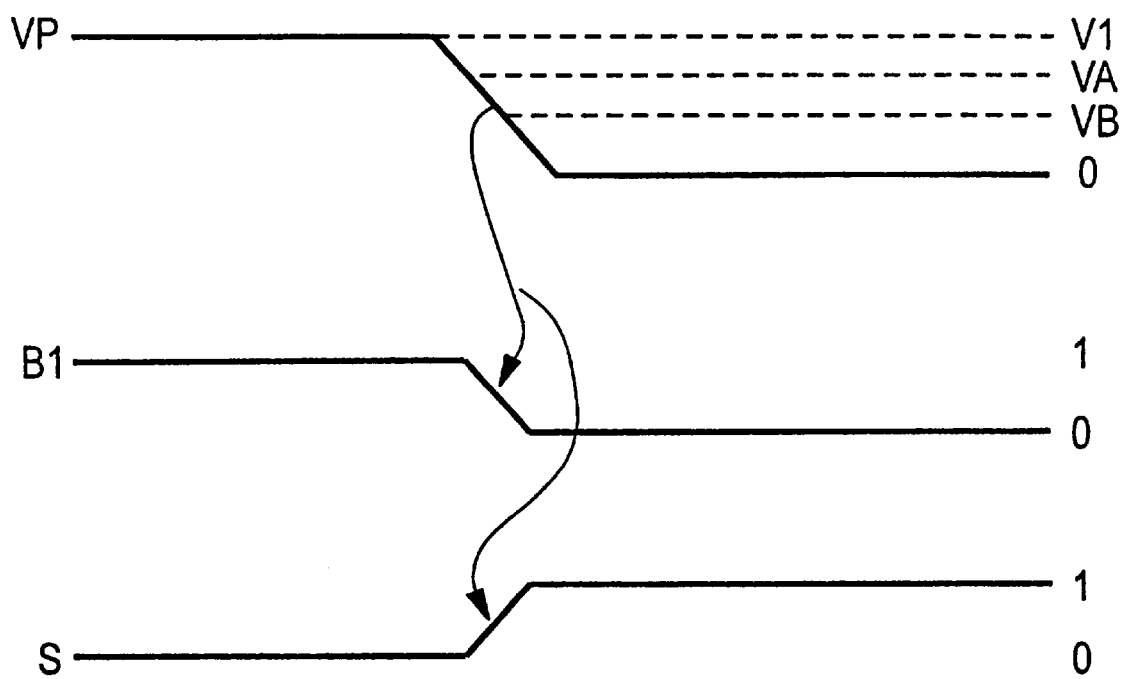

INTEGRATED CIRCUIT HAVING A CONTACT-MAKING POINT FOR SELECTING AN OPERATING MODE OF THE INTEGRATED CIRCUIT

BACKGROUND OF THE INVENTION

FIELD OF THE INVENTION

The invention relates to an integrated circuit having a contact-making point for selecting an operating mode of the integrated circuit.

An integrated circuit of this type is described in Published, European Patent Application EP 0 570 158 A2, for example. The contact-making point can optionally be connected to one of two different supply potentials of the integrated circuit. The integrated circuit has a control device that is connected to the contact-making point, identifies the supply potentials to which the contact-making point is connected, and generates a corresponding operating mode signal.

Furthermore, it is known to provide, for test purposes, contact-making points on integrated circuits which are connected to test circuits via which signals supplied from the test circuits can be monitored in the context of a test. The fact of whether specific voltages generated on the integrated circuit are actually present in the desired manner is often of interest here.

Since each contact-making point occupies a specific area on the integrated circuit and, in general, the area of an integrated circuit is intended to be kept as small as possible for reasons of cost, it is desirable to keep the number of contact-making points of the integrated circuit as small as possible.

SUMMARY OF THE INVENTION

It is accordingly an object of the invention to provide an integrated circuit having a contact-making point for selecting an operating mode of the integrated circuit which overcomes the above-mentioned disadvantages of the prior art devices of this general type, which makes it possible, by use of just one contact-making point, to set an operating mode of the integrated circuit and also to monitor a voltage generated on the circuit.

With the foregoing and other objects in view there is provided, in accordance with the invention, an integrated circuit, including:

a switching element having a control input;

a contact-making point for making external contact;

a voltage generator which has an output connected via the switching element to the contact-making point and the voltage generator generates a potential exceeding a first limit value in a first direction;

a first digital control device which has an input connected to the contact-making point and an output for outputting a digital control signal received by the control input of the switching element;

a second digital control device which has an input connected to the contact-making point and an output for outputting a digital operating mode signal;

the first digital control device only switching on the switching element via the digital control signal and the second digital control device outputting the digital operating mode signal with a first potential level, if a given potential of the contact-making point exceeds the first limit value in the first direction; and the first digital control device turning off the switching element via the digital control signal and the second control device outputting the digital operating mode signal with a second potential level, if the potential of the contact-making point exceeds a second limit value in a second direction.

The integrated circuit according to the invention has a first voltage generator having an output which is connected via a first switching element to a contact-making point for externally making contact with the circuit. At its output, the first voltage generator generates a first potential which exceeds a first limit value in a first direction. Furthermore, it has a first digital control device which has an input that is connected to the contact-making point, and has a first output for outputting a first digital control signal which is connected to a control input of the first switching element. A second digital control device has an input that is connected to the contact-making point, and an output for outputting a digital operating mode signal. The first control device only switches on the first switching element via the first digital control signal, and the second control device outputs the operating mode signal with a first potential level, when the potential of the contact-making point exceeds the first limit value in the first direction. The first control device turns off the first switching element via the first digital control signal, and the second control device outputs the operating mode signal with a second potential level, when the potential of the contact-making point exceeds a second limit value in a second direction. The first and second limit values are therefore chosen in such a way that they each exceed logical switching thresholds of the two control devices. In other words, one of the limit values is smaller than the smallest lower switching threshold of the two control devices and the other limit value is larger than the largest upper switching threshold of the two control devices. When the first limit value is exceeded in the first direction, the first switching element is turned on and the operating mode signal signals, with the first potential level, the presence of a first operating mode of the integrated circuit. When the second limit value is exceeded in the second direction, the first switching element turns off and the operating mode signal has a second potential level, which causes the integrated circuit to change over to a second operating mode.

The first control device ensures that the first switching element remains in the on state, as soon as it has been turned on, by feeding the first potential generated by the first voltage generator. The first potential then being present at the contact-making point, is fed back to the control input of the first switching element. As long as the first potential generated by the first voltage generator and present at the contact-making point via the first switching element does not exceed or fall below the first limit value, the first switching element remains switched on.

If, on the other hand, the intention is not for the first potential generated by the first voltage generator to be monitored by the contact-making point but rather for the operating mode of the integrated circuit to be altered, the contact-making point can have a fixed potential applied to it externally, the fixed potential exceeding the second limit value in the second direction. As a consequence of this, the digital output signals of the two control devices change their levels. The first switching element is turned off as a result of this, so that the first voltage generator is disconnected from the contact-making point and no current can then flow between the two. At the same time, the integrated circuit changes over its operating mode, since the operating mode signal at the output of the second control device also changes its level.

The contact-making point can, of course, also be connected to an external terminal of the integrated circuit—for example via a bonding wire. The operating mode of the circuit can then be set or the first potential monitored via the terminal.

The integrated circuit according to the invention affords the advantage that its contact-making point can be utilized both for monitoring the voltage generated by the first voltage generator and for setting the operating mode signal generated by the second control device. In order to monitor the voltage generated by the first voltage generator, the contact-making point can be connected to a corresponding measuring circuit.

According to a development, the integrated circuit has a resistance element, via which the contact-making point is connected to a terminal for a supply potential of the integrated circuit which exceeds the first limit value in the first direction or the second limit value in the second direction.

This has the advantage that the integrated circuit is put into a defined state during start-up, since the supply potential is also present at the contact-making point via the resistance element. By choosing a suitable supply potential, it is possible for example to achieve the situation where, during start-up of the integrated circuit (provided that no potential is applied to the contact-making point externally), the first switching element is initially always switched on via the first control device, with the result that the first voltage generator is connected to the contact-making point. As an alternative, by choosing another supply potential, it is possible to achieve the situation where the first switching element is always in the off state during start-up.

According to a development of the invention, the integrated circuit has a second voltage generator which has an output that is connected via a second switching element to the contact-making point and at which it generates a second potential, which exceeds the first limit value in the first direction. The first control device has a second output for outputting a second digital control signal, which is connected to a control input of the second switching element. The first control device only switches on the second switching element via the second digital control signal when the potential of the contact-making point exceeds the first limit value in the first direction. The first control device turns off the second switching element via the second digital control signal when the potential of the contact-making point exceeds the second limit value in the second direction. The first control device has an input for a selection signal, as a function of which it switches on only either the first or the second switching element at the same instant via the first and second control signals.

Via the selection signal, it is thus possible, by connecting the contact-making point to an external measuring unit, optionally to monitor the potential generated by the first voltage generator or the potential generated by the second voltage generator. Consequently, via one and the same contact-making point, it is possible for two different potentials of the integrated circuits to be monitored and also, in addition, for the operating mode of the integrated circuit to be established.

Other features which are considered as characteristic for the invention are set forth in the appended claims.

Although the invention is illustrated and described herein as embodied in an integrated circuit having a contact-making point for selecting an operating mode of the integrated circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 diagrammatic, block diagram of a first exemplary embodiment of an integrated circuit according to the invention;

FIG. 2 is a block diagram of a second exemplary embodiment; and

FIG. 3 is a graph of signal profiles relating to the exemplary embodiment from FIG. 1.

DESCRIPTION OF THE PREFERRED EMBODIMENTS

In all the figures of the drawing, sub-features and integral parts that correspond to one another bear the same reference symbol in each case. Referring now to the figures of the drawing in detail and first, particularly, to FIG. 1 thereof, there is shown a first voltage generator GI for generating a first potential V1, whose output is connected via a first switching element S1 to a contact-making point P of an integrated circuit. The contact-making point P (pad) serves for external contact making for the integrated circuit. It is connected via a first control device C1 in the form of a non-inverting driver to a control input of the first switching element S1, which is a transfer gate with an n-channel and a p-channel transistor. Furthermore, the contact-making point P is connected to a circuit unit 10 of the integrated circuit via a second control device C2 in the form of an inverting driver, which supplies an operating mode signal S at its output. The circuit unit 10 is put into different operating modes by the operating mode signal S. The contact-making point P is connected to a supply potential V of the integrated circuit via a high-value resistance element R.

The integrated circuit may be any desired integrated circuit, for example a memory circuit or a logic circuit.

The circuit illustrated in FIG. 1 functions as described below. During start-up, the supply potential V is present at the contact-making point P via the resistance element R, provided that a potential that differs from this is not applied to the contact-making point P from outside the integrated circuit. In alternative embodiments of the invention, it is also possible for the resistance element R to be omitted and, during start-up, for a corresponding potential to be applied to the contact-making point P externally in order to put the integrated circuit into a desired initial state. The circuit illustrated in FIG. 1 is dimensioned in such a way that the supply potential V established at the contact-making point P during start-up lies above an upper switching threshold of the first control device C1 and above an upper switching threshold of the second control device C2. That is to say that the supply potential exceeds a limit value in a first, namely positive, direction. Consequently, the first control device C1 supplies a first control signal B1 with a high level at its output and the second control device C2 supplies the operating mode signal S with a low level at its output.

The low level of the operating mode signal S has the effect that the integrated circuit or the circuit unit 10 is in a first operating mode. The high level of the first control signal B1 has the effect that the first switching element S1 is switched on, as a result of which the output of the first voltage generator G1 is connected to the contact-making point P. Consequently, the first potential V1 is present at the contact-making point P. To ensure that no interfering current flows via the resistance element R, it is expedient to choose the supply potential V to be equal to the first potential V1. Since the resistance element R has a high resistance, a high current does not flow through it if the potential of the contact-making point P has a low level. On the other hand, the first potential V1 is connected to the contact-making point P in a low-resistance manner with the first switching element S1 in the on state, with the result that the potential can expediently be tapped off via the contact-making point P from outside the integrated circuit for monitoring purposes.

The switching thresholds of the two control devices C1, C2 are chosen in such a way that the first potential V1 exceeds them in every case (that is to say that the first potential V1 also exceeds the first limit value in the positive direction), with the result that the first switching element S1 remains switched on and the operating mode signal S has a low level. In this state, the contact-making point P can be connected to a measuring device that detects the potential of the contact-making point P and thus implements monitoring of the first potential V1.

If monitoring of the first potential V1 is concluded or is no longer desired, a potential having a low level (for example ground), which lies below the lower switching thresholds of the two control devices C1, C2, can be applied to the contact-making point P externally. This is equivalent to a second limit value, namely the smallest Lower switching threshold of the two control devices, being exceeded in the negative direction. As a consequence of this, the first control signal B1 at the output of the first control device C1 and the operating mode signal S at the output of the second control device C2 change their levels. The first control signal B1 subsequently has a low level, with the result that the first switching element S1 turns off and the first voltage generator G1 is disconnected from the contact-making point P. The first potential V1 then no longer influences the potential of the contact-making point P. The operating mode signal S then has a high level, thereby indicating to the circuit unit 10 connected to the output of the second control device C2 that a changeover to a second operating mode is present. The integrated circuit remains in the second operating mode as long as the contact-making point P remains connected to the low potential. By way of example, the connection can be achieved permanently by a bonding wire that connects the contact-making point P to a corresponding supply potential of the integrated circuit.

FIG. 2 shows a second exemplary embodiment of the invention, which differs from the exemplary embodiment illustrated in FIG. 1. The contact-making point P is connected via the resistance element R to the first potential V1 that is generated by the first voltage generator G1. In this case, the resistance element R is an n-channel transistor connected as a diode. The inverting driver of the second control device C2 is supplied by the first potential V1. In addition to the first voltage generator G1, the integrated circuit has a second voltage generator G2, which generates a second potential V2, its output being connected to the contact-making point P via a second switching element S2, likewise a transfer gate. The second potential V2 is more positive than the first potential V1. The first control device C1 has a first output, which is connected to the control input of the first switching element S1, and a second output, which is connected to a control input of the second switching element S2. The first control device C1 generates a first digital control signal B1 at the first output and a second digital control signal B2 at the second output. Furthermore, the first control device C1 has a multiplexer MUX having an input for the application of a selection signal A. The multiplexer MUX additionally has an activation input EN connected to the contact-making point P. The multiplexer MUX has two outputs, which are connected via a respective level shifter LS to the first and second outputs of the first control device C1.

The exemplary embodiment according to FIG. 2 functions as described below. During the start-up of the circuit, the resistance R ensures that the first potential V1 is present at the contact-making point P. The resistance element R has a relatively high resistance. Therefore, in order to monitor the first potential V1, the first voltage generator G1 is connected to the contact-making point P via the low-resistance first switching element S1. This will be discussed further below. During start-up, however, the two switching elements S1, S2 are initially turned off. The first potential V1 connected to the contact-making point P via the resistance element R ensures that the multiplexer MUX is activated via its activation input EN. V1 a the selection input A of the multiplexer MUX, it is possible to select which of the two switching elements S1, S2 is to be switched on with the multiplexer MUX activated.

An additional contact-making point may optionally serve for feeding in the selection signal A, so that the selection signal A can be fed in externally, or else the selection signal A can be derived from signals that are already present on the integrated circuit. An additional contact-making point is not necessary then.

The two level shifters LS are fed by the second potential V2, which is more positive than the first potential V1. Therefore, the two control signals B1, B2 have a high level, which is equal to the second potential V2, on account of the level shifters LS. Depending on the level of the selection signal A, only one of the level shifters LS is activated via the outputs of the multiplexer MUX with the latter activated, whereby only the control signal B1; B2 of the level shifter LS has a level with which the corresponding switching element S1, S2 is switched on. As a consequence of this, either the output of the first voltage generator G1 or the output of the second voltage generator G2 is connected to the contact-making point P. Consequently, either the first potential V1 or the second potential V2 is present at the contact-making point P. The potential can then be detected by an external measuring apparatus in each case. Since the second potential V2 is more positive than the first potential V1, the second potential V2 also exceeds the first limit value in the positive direction. For this reason, the multiplexer MUX remains activated via its activation input EN even with the second switching element S2 switched on. In addition, the operating mode signal S at the output of the second control device C2 remains at a low level both with the first switching element S1 in the on state and with the second switching element S2 in the on state. Consequently, the integrated circuit is in the first operating mode during this period of time.

If the intention is not to detect the first V1 or second V2 potential but to put the integrated circuit into a second operating mode, in which the operating mode signal S has a high level, the contact-making point P is connected to a low potential (for example ground), which lies below the activation threshold of the multiplexer MUX and below the switching threshold of the second control device C2 (exceeding of the second limit value in the negative direction). As a consequence of this, the multiplexer MUX is deactivated, so that the two switching elements S1, S2 are turned off. Since the resistance element R has a very high resistance, the current flowing between the first potential V1 and the low potential of the contact-making point P is negligibly small.

In the case of the exemplary embodiments outlined, it is possible, during a first operating mode of the integrated circuit in which the operating mode signal S has a low level, for at least one potential V1, V2 generated on the integrated circuit to be monitored externally via the contact-making point P and, on the other hand, provided that an operating mode changeover is desired and if none of the potentials V1, V2 is intended to be monitored, for a low potential to be applied to the contact-making point P externally, with the result that the level of the operating mode signal S changes from low to high.

An example of expedient dimensioning would be for the switching thresholds of the two control devices C1, C2 and/or the activation threshold of the multiplexer MUX to be at a potential which is half as large as the first potential V1. It is then ensured that in the event of fluctuations in the first potential V1 by 50% of its value, the corresponding switching element S1, S2 remains switched on and the operating mode signal S retains the low level. In this way, fluctuations in the first potential V1 which do not go beyond 50% of its value can be monitored from outside the integrated circuit via the contact-making point P.

FIG. 3 shows signal profiles of a potential VP of the contact-making point P, of the first control signal B1 and of the operating mode signal S concerning the exemplary embodiment from FIG. 1. The first switching element S1 is in the on state in the left-hand half of FIG. 3 and it is turned off in the right-hand half as a result of a low potential of 0 V having been applied externally to the contact-making point P. FIG. 3 reveals that the first potential V1 lies above the first limit value VA, which exceeds the upper switching thresholds of the two control devices C1, C2. In addition, it is evident that the externally applied potential of 0 V falls below the second limit value VB, which lies below the lower switching threshold of the two control devices C1, C2, whereupon a level change takes place at the outputs of the latter.

We claim:

1. An integrated circuit, comprising:
   a switching element having a control input;
   a conact-making point for making external contact;
   a voltage generator having an output connected via said switching element to said contact-making point and said voltage generator generating a potential exceeding a first limit value in a first direction;
   a first digital control device having an input connected to said contact-making point and an output for outputting a digital control signal received by said control input of said switching element;
   a second digital control device having an input connected to said contact-making point and an output for outputting a digital operating mode signal;
   said first digital control device only switching on said switching element via the digital control signal and said second digital control device outputting the digital operating mode signal with a first potential level, if a given potential of said contact-making point exceeds the first limit value in the first direction; and
   said first digital control device turning off said switching element via the digital control signal and said second control device outputting the digital operating mode signal with a second potential level, if the potential of the contact-making point exceeds a second limit value in a second direction.

2. The integrated circuit according to claim 1, including a resistance element via which said contact-making point is to be connected to a terminal of a supply potential exceeding one of the first limit value in the first direction and the second limit value in the second direction.

3. The integrated circuit according to claim 1, including:
   a further switching element having a control input;
   a further voltage generator having an output connected via said further switching element to said contact-making point and generating a further potential exceeding the first limit value in the first direction;
   said first digital control device having a further output for outputting a further digital control signal received by said control input of said further switching element, said first digital control device only switching on said further switching element via the further digital control signal if the potential of said contact-making point exceeds the first limit value in the first direction, said first digital control device turning off said further switching element via the further digital control signal if the potential of said contact-making point exceeds the second limit value in the second direction, said first digital control device having a further input for receiving a selection signal and in dependence on the selection signal said first digital control device switches on only one of said switching element and said further switching element at the same instant via the digital control signal and the further digital control signal.

* * * * *